United States Patent
Nentl et al.

[11] Patent Number: 6,082,547
[45] Date of Patent: Jul. 4, 2000

[54] ADAPTER JIG

[75] Inventors: Robert J. Nentl, Lakeville; James R. Nigg, Delano, both of Minn.

[73] Assignee: Fluoroware, Inc., Chaska, Minn.

[21] Appl. No.: 09/049,240

[22] Filed: Mar. 27, 1998

[51] Int. Cl.[7] .................................................. B65D 85/00
[52] U.S. Cl. .......................... 206/724; 206/725; 206/560
[58] Field of Search .................................... 206/722, 723, 206/724, 725, 701, 560, 565, 499

[56] References Cited

U.S. PATENT DOCUMENTS

| | | |
|---|---|---|
| 4,379,505 | 4/1983 | Alemanni . |
| 4,549,651 | 10/1985 | Alemanni . |
| 4,620,632 | 11/1986 | Alemanni . |
| 5,080,228 | 1/1992 | Maston, III et al. ................... 206/724 |
| 5,114,005 | 5/1992 | Cote et al. . |
| 5,310,076 | 5/1994 | Burton . |
| 5,337,893 | 8/1994 | Nami et al. . |
| 5,400,904 | 3/1995 | Maston, III et al. ................... 206/725 |
| 5,481,438 | 1/1996 | Nemoto . |
| 5,531,329 | 7/1996 | Hayakawa et al. ................... 206/722 |
| 5,731,230 | 3/1998 | Nevill et al. . |

*Primary Examiner*—Jacob K. Ackun
*Attorney, Agent, or Firm*—Douglas J. Christensen

[57] ABSTRACT

A plastic jig which may be injection molded has a plurality of square pockets, each pocket having a pair of integral spring loaded fingers on two adjacent sides of square component trays for repeatedly and consistently positioning the component trays placed in said pocket. The resiliency of said spring loaded fingers operate to urge the square tray against fixed locating portions of the pocket. Features on the top and bottom of the jig provide for the secure stacking of jigs while holding trays. An upper jig above an adjacent lower jig provides a cover, enclosing the components in the tray in lower jig.

21 Claims, 7 Drawing Sheets

Fig. 1
PRIOR ART
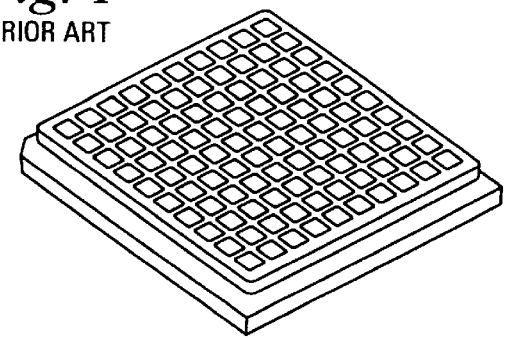
Fig. 2a
PRIOR ART
Fig. 2b
PRIOR ART
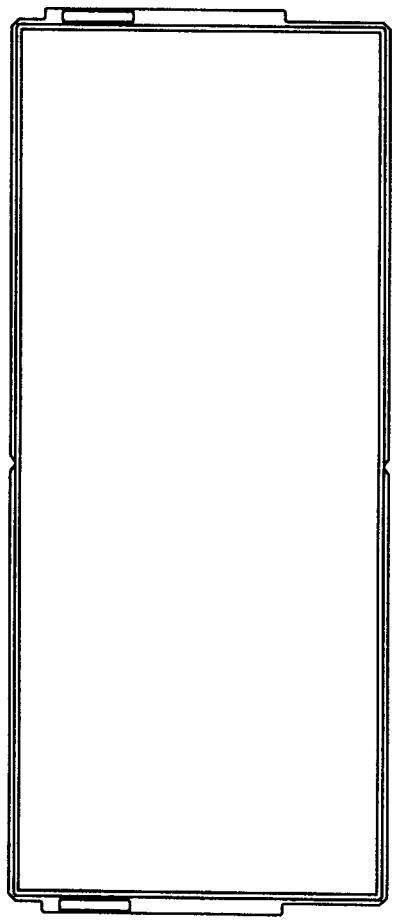
Fig. 2c
PRIOR ART

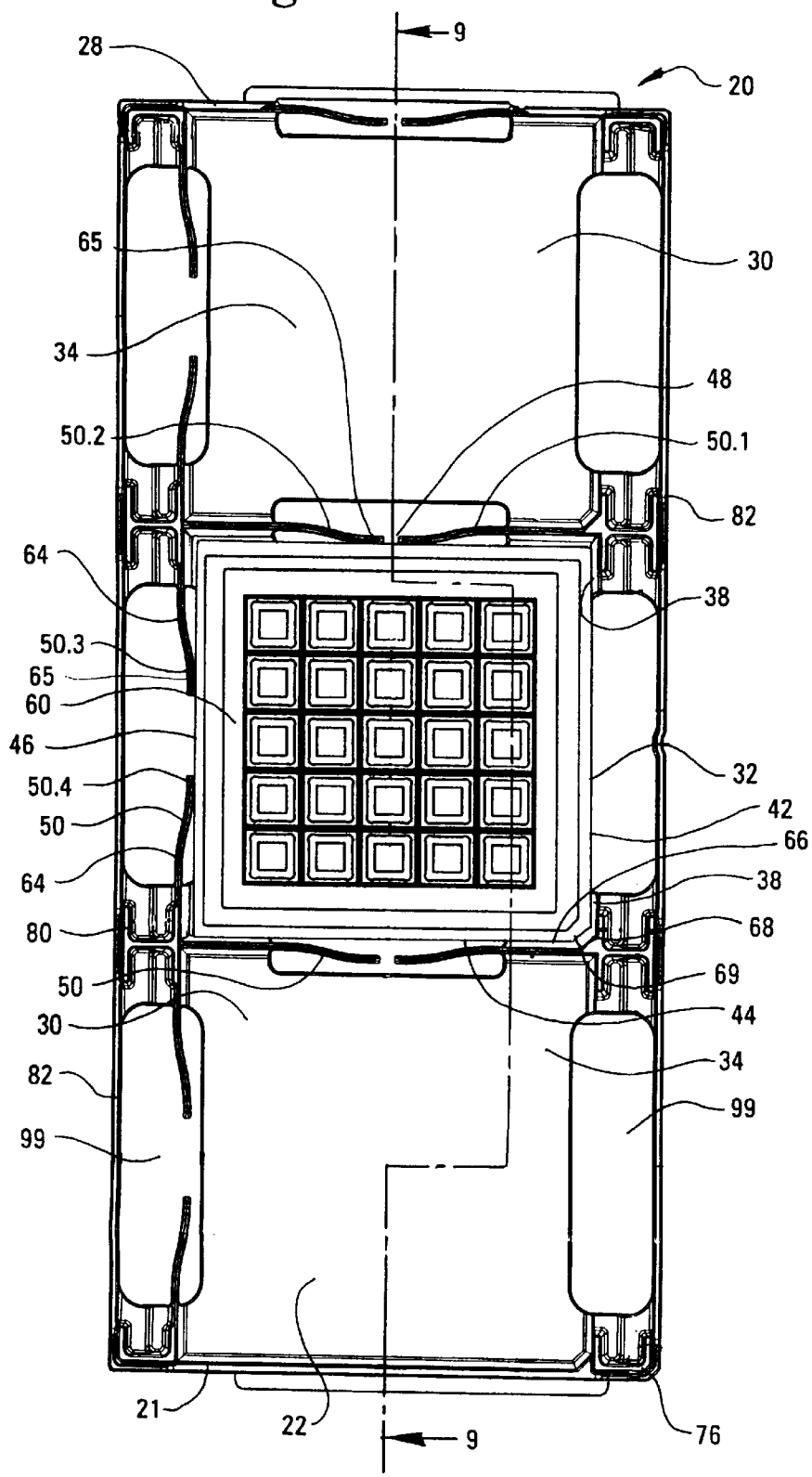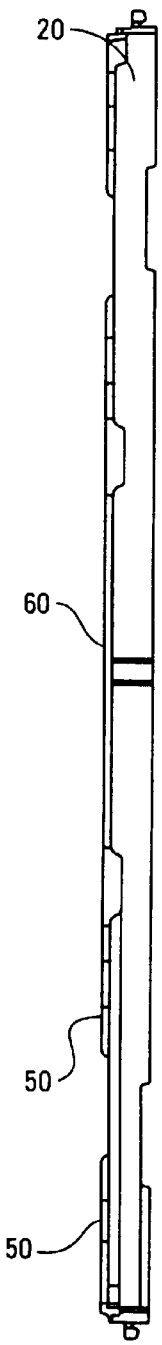

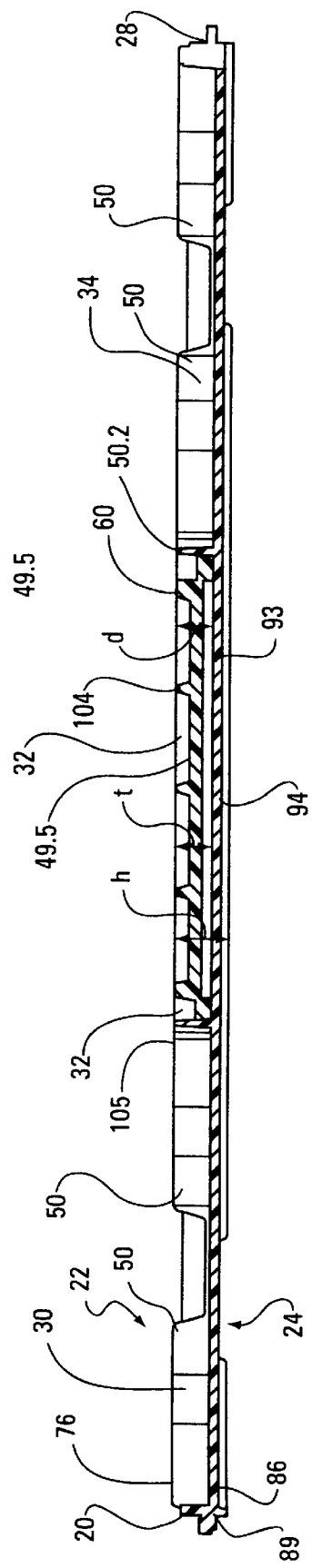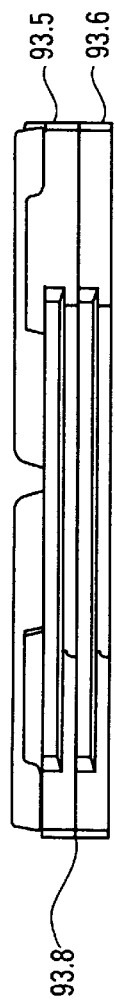

ADAPTER JIG

BACKGROUND OF THE INVENTION

This invention relates to material handling equipment; more particularly the invention relates to apparatus for handling and storing integrated circuit components.

Integrated circuit components are commonly transported and stored in plastic injection molded trays. The trays have pockets aligned in a matrix pattern on the top side of the trays and will vary in size and shape according to the component's size and the tray capacity. Referring to FIG. 1, a prior art matrix tray is shown. Informal industry standards for tray dimensions have been developed around such matrix trays. For example standardized square tray side dimensions are two inches, three inches and four inches.

Referring to FIGS. 2A, 2B and 2C, formally adopted Joint Electron Device Engineering Council (JEDEC) standards also provide tray outline configurations and dimensions for packaged integrated circuits as shown. These JEDEC standards facilitate the use of automated component handling equipment for selecting and picking up components. Such equipment will have the tray placed in a receiver for precise location and robotic arms with suitable pickup devices will selectively retrieve the components utilizing previously stored pocket location data. One JEDEC Publication No. 95-1, provides a tray outline of 322.6 mm by 135.9 mm, and a thickness of 7.62 mm or 12.19 mm depending on whether the tray is a thin tray or a thick tray. A commercially available tray manufactured in accordance with Publication No. 95-1 is shown in FIG. 3 and having component pockets 10.

The JEDEC outline matrix tray format has gained industry wide acceptance for automated component handling. Referring to FIG. 4, jigs are known which have the standard JEDEC outline to fit existing automated component handling equipment using the 95-1 standard format and which have three pockets 11 to receive four inch trays such as the type shown in FIG. 1. Such jigs were machined of aluminum and due to the inherent tolerances both in the tray and in the jigs, did not provide optimal repeatable component location for robotic pickup. Additionally, such jigs did not readily accommodate stacking, were heavy and were expensive to manufacture.

An inexpensive to manufacture jig is needed that would provide positive and repeatable positioning of a tray in a jig and corresponding the components in the tray. Moreover, such a tray should be readily stackable with other such jigs and provide enclosure and protection for the components held therein.

SUMMARY OF THE INVENTION

A plastic jig which may be injection molded has a plurality of square pockets, each pocket having a pair of integral spring loaded fingers on two adjacent sides of square component trays for repeatedly and consistently positioning the component trays placed in said pocket. The resiliency of said spring loaded fingers operate to urge the square tray against fixed locating portions of the pocket. Features on the top and bottom of the jig provide for the secure stacking of jigs while holding trays. An upper jig above an adjacent lower jig provides a cover, enclosing the components in the tray in lower jig.

A feature and advantage of the invention is that the spring loaded fingers may be integrally molded into the jig at apertures eliminating any assembly of the jig and facilitating relatively simple molding of same. Additionally, when formed of plastic the jig is very low in weight compared to the conventional aluminum jigs.

Another feature and advantage of the invention is that stacked jigs with trays and components in the trays provide protection for the components. Such stacked jigs, trays, and components may be shipped or stored in such configuration.

Another feature and advantage of the invention is that the bias provided to the trays in the jigs operates to positively locate the tray and components and also functions to secure the tray within the jig.

A feature and advantage of the invention is that positive repeatable positioning of the trays is provided by urging the trays towards fixed locating portions of the pocket.

BRIEF DESCRIPTION OF THE DRAWINGS

FIG. 1 is a perspective view of a prior art matrix carrier.

FIG. 2A is a plan view outline of a prior art tray according to JEDEC standards.

FIG. 2B is a side view outline of a prior art tray according to JEDEC standards.

FIG. 2C is an end view outline of a prior art tray in accordance with JEDEC standards.

FIG. 7 is a plan view of an adaptor jig holding a matrix tray in accordance with the invention.

FIG. 8 is a front elevational view of the adaptor jig with matrix tray as shown in FIG. 7.

FIG. 9 is a sectional view of the adaptor jig of FIG. 7 taken at line 9—9 with a matrix tray in place.

FIG. 10 is an end view of a pair of adaptor jigs in a stacked arrangement in accordance with the invention.

DETAILED SPECIFICATION

Figure 3:
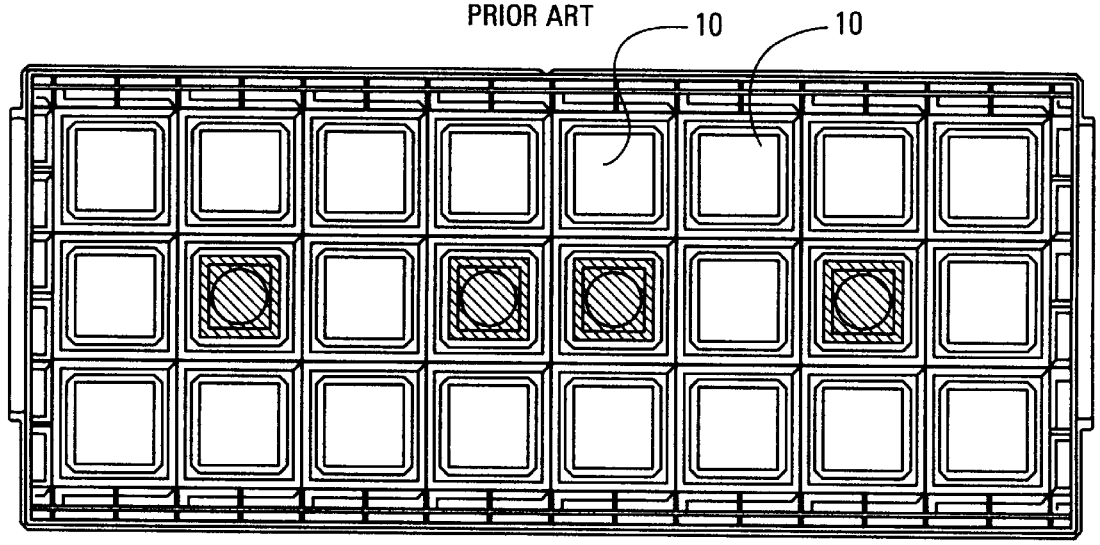
FIG. 3 is a plan view of prior art tray in accordance with JEDEC standards.
Figure 4:
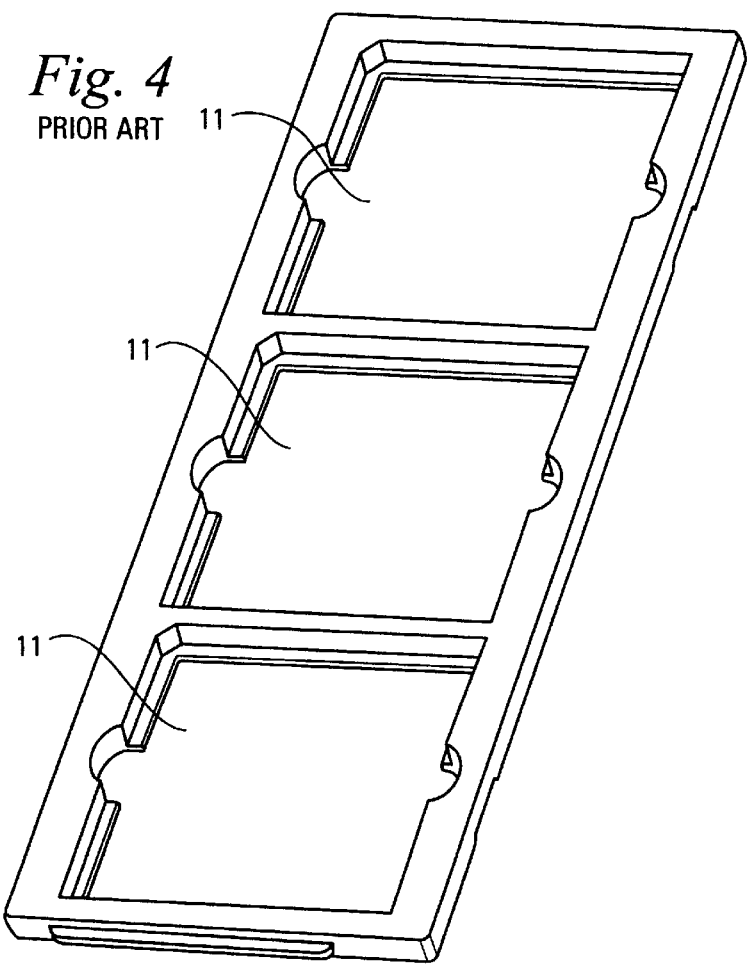
FIG. 4 is a perspective view of a prior art adaptor jig.
Figure 5:
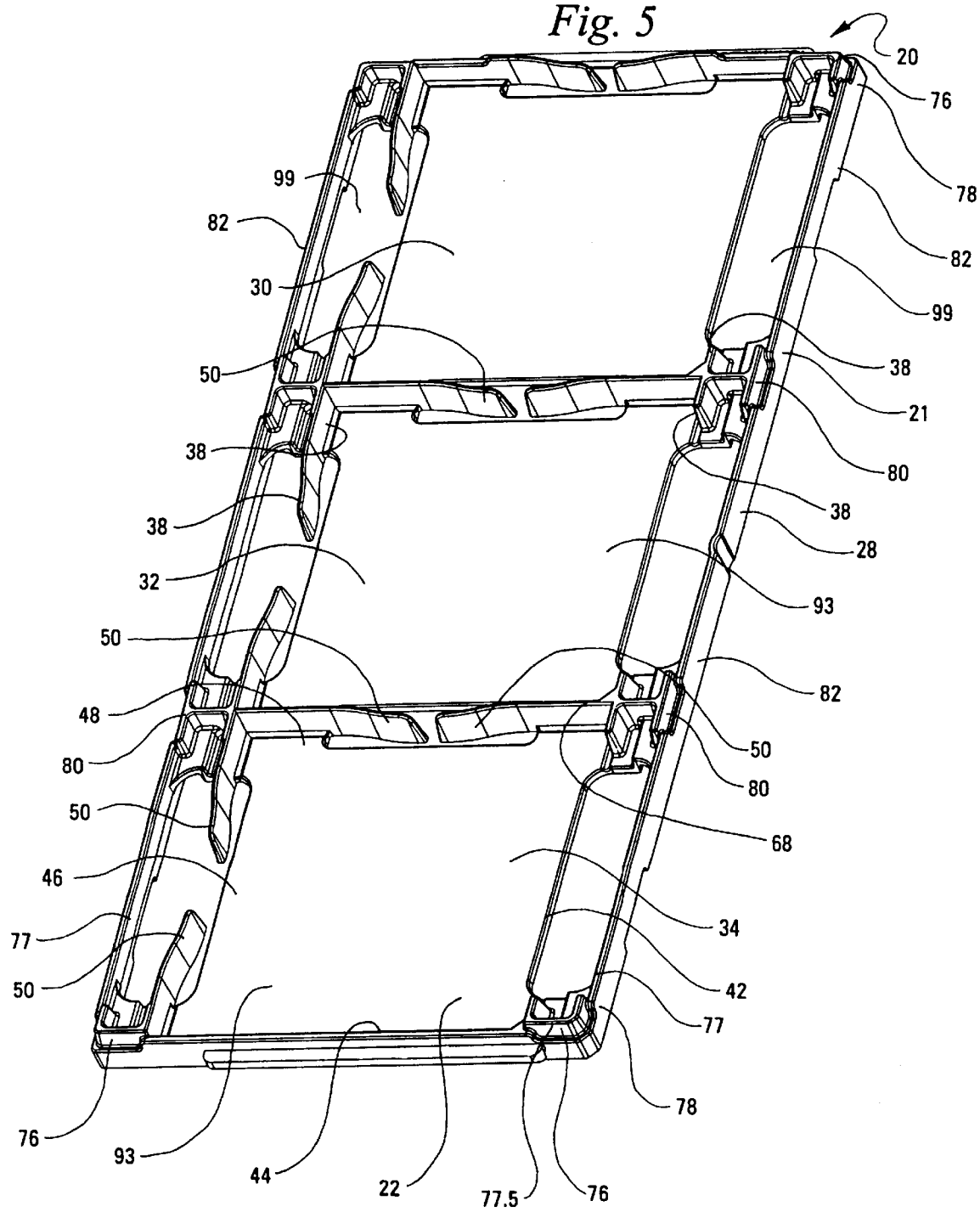
FIG. 5 is a perspective view of the top side of an adaptor jig in accordance with the invention.
Figure 6:
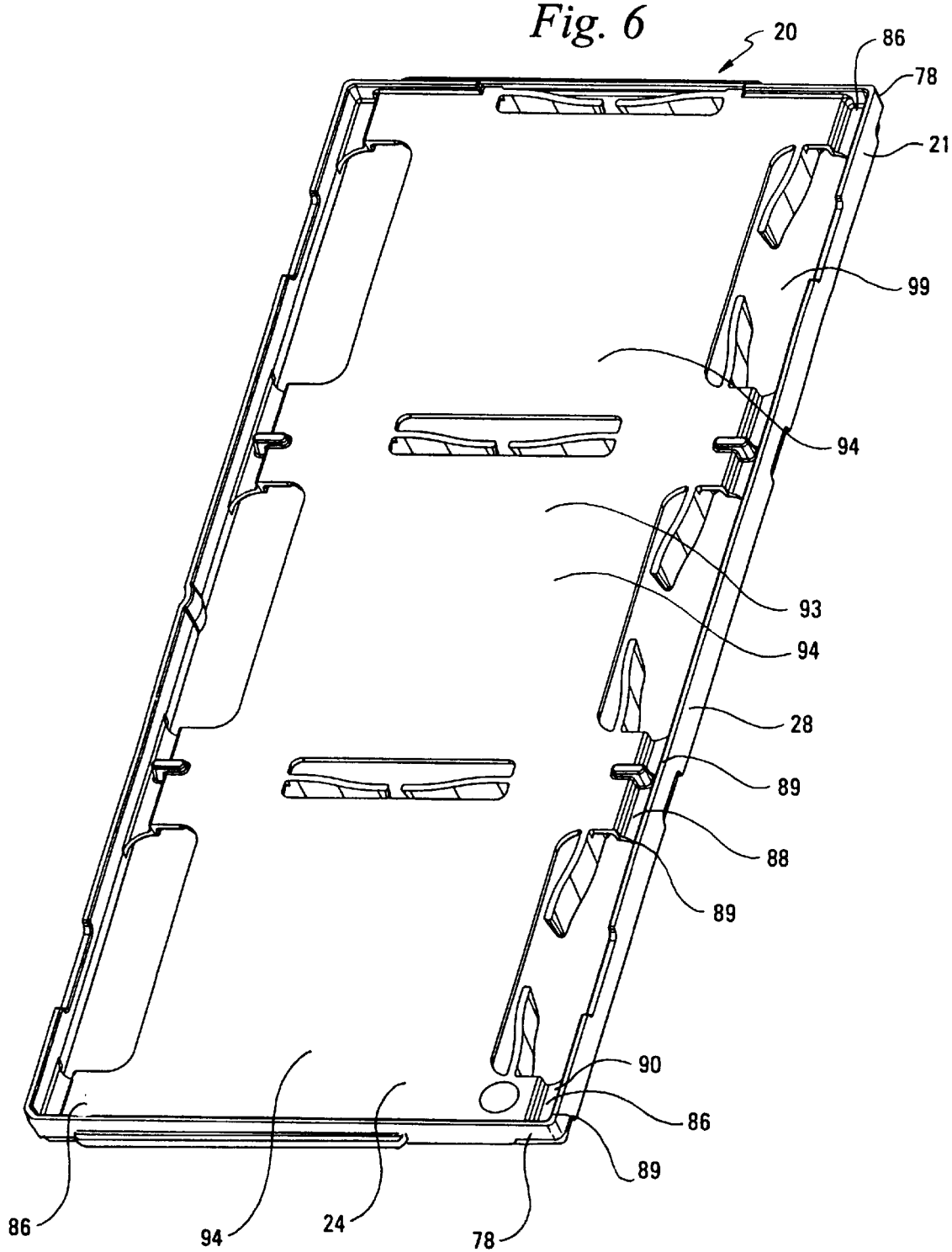
FIG. 6 is a perspective view of the bottom side of an adaptor jig in accordance with the invention.

Referring to FIGS. 5, 6, 7, 8, and 9, several views of an adaptor jig in accordance with the invention are depicted and are generally designated with the numeral 20. The adaptor jig 20 has a support structure 21 with a top side 22 and a bottom side 24 and an outer peripheral portion 28. On the top side are a plurality of pockets 30, 32, 34 configured for holding a specific sized matrix tray such as that shown in FIG. 1. Each pocket is defined by pocket perimeter portions 38. Each pocket has four sides, a first side 42, a second side 44, a third side 46, and a fourth side 48. At the third and fourth sides 46, 48 are resiliently flexible and moveable tray positioning members 50. Said moveable tray positioning members are configured as fingers extending along the third and fourth sides 46, 48 of the pocket and in an unflexed position extend slightly into the pocket.

Referring to FIGS. 7, 8 and 9, a matrix tray 60 is in place in the central pocket of the adaptor jig 20. The matrix tray has component pockets 49.5 which may be for any integrated circuit chips or packages including bare die, known good die, CSP, MQFP, TQFP, CQFP, TSOP, TSSOP, SSOP, CBGA, QFP, and BGA configurations.

The moveable tray positioning members 50.1, 50.2, 50.3, and 50.4 are flexed slightly outwardly from the pocket to accommodate the tray 60 in said pocket. Said outward flexing puts the arm portion 64 of each positioning member under stress thereby providing the engagement portions 65 with an inward bias acting on the tray 60. In that the inward bias is on the third side 46 and fourth side 48 of the tray receiving pocket 32 the tray is urged towards the first side 42 and second side 44 of said pocket. The pocket perimeter portions 38 include a fixed tray location portion 66 which is configured as a beveled corner 68 which accepts the beveled corner 69 of the matrix tray 60.

Referring to FIG. 9, note that the tray height t is less than the height h of the jig and the tray height t is equal to or less than the tray pocket depth d. The top surface 104 of the tray 60 is flush with or lower than the top surface 105 of the jig 20.

The support structure 21 has the outer peripheral portion 28 which is substantially sized to the JEDEC standard no. 95-1. Said standard provides for the width, length and thickness of a matrix tray and correspondingly of a preferred embodiment of the present invention. The outer peripheral portion 28 includes stacking structure 76 including an upper lip 77 and protruding members 77.5 on the top side corners 78 of the jig and additional intermediate stacking structure 80 on the long sides 82 of the jig. Said stacking structure 76, 80 cooperates with cooperating bottom side stacking structure 86, 88 configured as a lower lip 89 and recessed regions 90 at the corners and intermediate the corners on the long sides. Thus, as shown in FIG. 10, a plurality of jig adapters may be vertically stacked on top of one another and with the upper stacking structure 76 engaged within the stacking structure on the bottom side of the jig. Adjacent jigs will be substantially immoveable laterally with respect to one another. Moreover, referencing FIGS. 6 and 10, the bottom panel 93 of each pocket 30, 32, 34 of an above positioned jig 93.5, constitutes a cover 94 which effectively operates to cover and protect the components in a tray in a lowered positioned jig 93.6. Each adjacent pair of jigs thus provides an enclosure 93.8 for the matrix trays and components held therein.

The support structure has several apertures 99 which extend from the top side 22 to the bottom side 24. These apertures facilitate molding of the jig, particularly the flexible tray positioning members 50. With the flexible members positioned at the aperture, a simple two-piece mold may be used for molding the jig and additional machining operations are not necessary. Moreover, the stacking structure including the upper and lower lips 77, 89 and the protruding members 77.5, are formed of relatively thin plastic to minimize warpage of the molded part and to conserve material.

Figure 13:
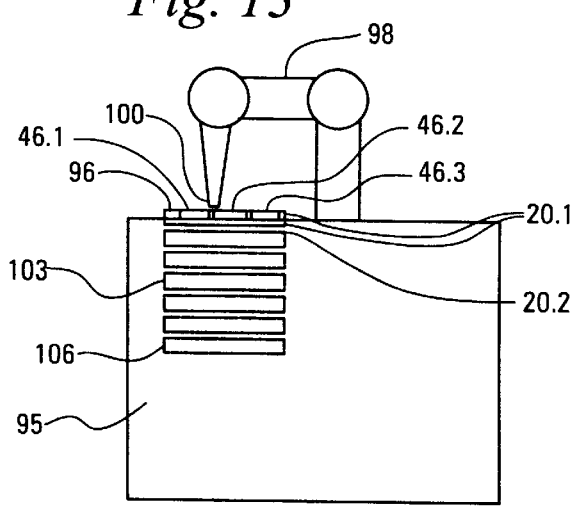
FIG. 13 is a schematic elevational view of a component handling equipment.

Referring to FIG. 13 a side elevational view of a piece of component handling equipment 95 is depicted and includes a receiver portion 96 for accepting JEDEC sized trays. A selection portion 98 of the equipment includes a vacuum or other suitable type of moveable pickup 100 to select components from a tray placed in the receiver portion 96. The component handling equipment, specifically the receiver, includes an elevator 106 which accepts and receives a stack 102 of adaptor jigs with trays and components. Three matrix trays 46.1, 46.2, 46.3 in the uppermost jig 20.1 are presented for selection of specific components by the selection portion 98. The components are positively positioned by way of the moveable tray positioning members, not visible in this view. FIG. 13 is a generalized portrayal of a component handling equipment and such equipment may, of course, be of multiple configurations. Such equipment will have a receiver sized for either a single tray or a stack of trays and may be associated with or integral with other processing, assembly, inspection, testing or packaging equipment. For the purposes of this application said trays, sized for the equipment, are designated the first tray with a first tray size. In a preferred embodiment, said first size is defined by JEDEC Publication No. 95-1. The adaptor jig of the instant invention as shown in FIGS. 5–10 is of the first tray size and is used in said component handling equipment in lieu of the first trays. The second tray of the second tray size is such as the square configured tray such as shown in FIGS. 1, 7 or 9.

Figure 11:
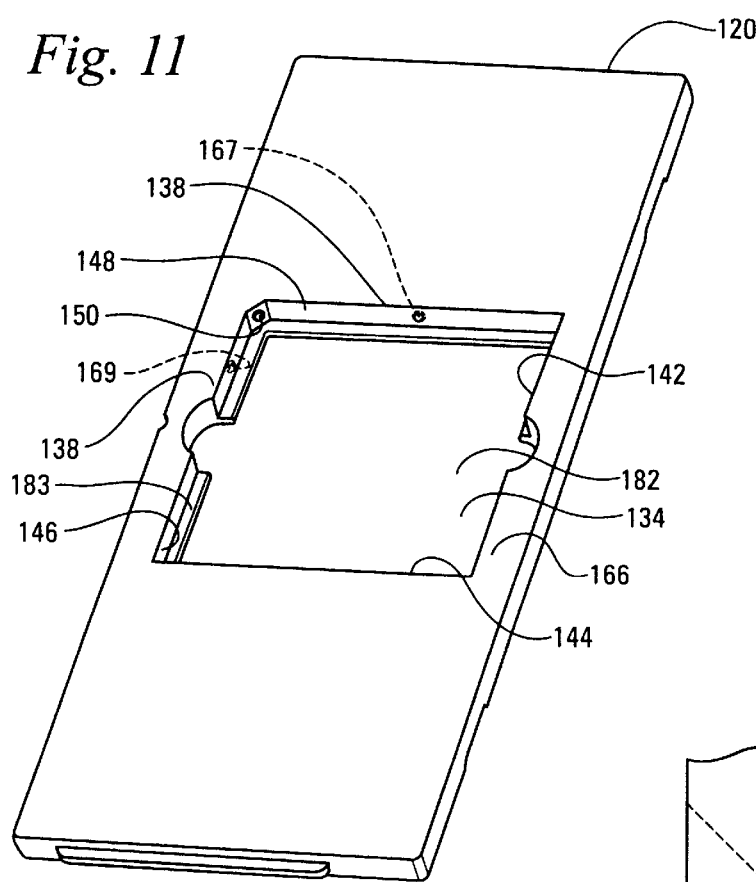
FIG. 11 is a perspective view of an adaptor jig in accordance with the invention.
Figure 12:
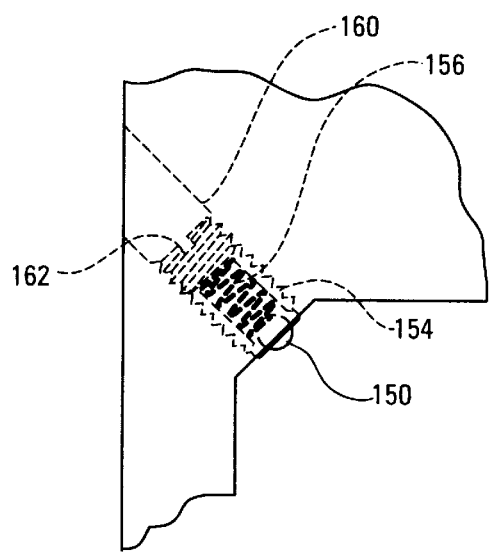
FIG. 12 is a plan view of a portion of FIG. 11 showing details of the moveable tray positioning member.

Referring to FIGS. 11 and 12, an additional embodiment of an adaptor jig is shown and is designated with the numeral 120. Said embodiment utilizes a rectangular plate which may be sized in accordance with JEDEC Publication No. 95-1 and includes one or more pockets 134 for holding matrix trays. Said pocket has a first side 142, a second side 144, a third side 146 and a fourth side 148. The pocket is defined by the pocket perimeter portions 138 which includes a fixed tray location portion 166 which in this embodiment is comprised of the pocket sides 142 and 144. Opposite the fixed tray positioning portion is a first moveable positioning member 150 which is comprised of a spherical metallic ball in a housing 154. The ball 150 is biased inwardly towards the pocket by coiled spring 156. The housing 154 is secured within a bore 160 by way of a set screw 162. Said moveable tray positioning member 150 operates on the beveled corner of the matrix tray received in the pocket, not shown in these views. Alternatively, such moveable members may be positioned at the sides of the pockets such as shown at location 167 and 169 on FIG. 10 or on the opposite sides. This embodiment discloses an open lower region 182 with shelves 183 for seating the tray compared to the closed lower region of the jig of FIGS. 5, 6, 7 and 8. Alternatively, the configuration of FIG. 10 could also have a closed lower region.

The embodiments as shown, particularly the embodiments of FIGS. 5, 6, 7, 8, 9 and 10, may be formed of injection molded plastic such as polybutyl terephthalate (PBT), polyetheretherketone (PEEK), polypropylene (PP), acrylonitrile butadiene styrene (ABS), or other plastics which are conventionally utilized in chip trays. These materials may have carbon powder or carbon fiber as fill for providing static dissipative characteristics.

The present invention may be embodied in other specific forms without departing from the spirit or essential attributes thereof, and it is therefore desired that the present embodiment be considered in all respects as illustrative and not restrictive, reference being made to the appended claims rather than to the foregoing description to indicate the scope of the invention.

What is claimed is:

1. A combination jig for component handling equipment and a plurality of component trays receivable in said jig, the component handling equipment having a component carrier receiver portion sized for a first rectangular component tray of a first size, the jig for adapting said equipment to utilize a component tray of a second size smaller than the first rectangular component tray, each of the plurality of component trays having a rectangular tray perimeter, a top surface, and a plurality of pockets at said top surface arranged in a matrix pattern for holding a plurality of semiconductor components, the jig comprising:

a support structure with a top side, a bottom side, and a rectangular peripheral portion sized for being received by the component carrier receiver portion, the support structure having a plurality of pocket perimeter portions defining a a plurality of tray receiving pockets, each pocket including a nonmoveable corner, and each of said tray receiving pockets sized for one of the plurality of trays of the second size; and a plurality of first moveable tray positioning members, one of the first moveable tray positioning members extending from the support structure into the tray receiving pocket, said first tray positioning member having a bias inwardly towards said pocket for urging a tray of the second size positioned in the pocket toward the corner whereby the tray of the second size is positively positioned in said pocket at said nonmoveable corner.

2. The jig of claim 1 wherein the first tray positioning member is spherical and wherein the jig further comprises a coiled spring engaged with the positioning member for providing the inward bias.

3. The jig of claim 2 wherein the tray receiving pocket has four corners and wherein the first tray positioning member extends from one of said corners.

4. The combination of claim 1 wherein the jig is integrally formed of injection molded plastic.

5. The combination of claim 4 wherein each of the first tray positioning members are integral fingers formed of injection molded plastic.

6. The combination of claim 1 wherein each of the tray receiving pockets has four sides and each of the first positioning members extends from one of the four sides of the respective pocket, the jig further comprising a plurality of second tray positioning members, each of said second tray positioning members extending from an adjacent second side of the four sides of the respective pocket, said second moveable tray positioning member extending from the support structure into the respective tray receiving pocket, said second moveable tray positioning member having a bias inwardly toward said pocket for urging said tray of the second size positioned in the pocket into the corner.

7. The jig of claim 6 wherein the first and second tray positioning members are spherical and wherein the jig further comprises first and second coiled springs engaged with the first and second positioning members respectively for providing the inward biased to said first and second tray positioning members.

8. The combination of claim 6 wherein the support structure is formed of injection molded plastic.

9. The combination of claim 8 wherein the first and second tray positioning members are integrally formed with the support structure.

10. The combination of claim 9 wherein the first and second tray positioning members are configured as fingers extending along their respective sides of the tray receiving pocket.

11. The combination of claim 1 wherein the rectangular peripheral portion includes stacking structure whereby a plurality of such jigs can be vertically stacked while substantially eliminating lateral movement of one jig with respect to an adjacent stacked jig.

12. The combination of claim 11 wherein the jigs have a height wherein the component trays of the second size have a thickness less than the height of such jigs, and wherein the plurality of such jigs may be vertically stacked with trays of the second size positioned in the pockets of said plurality of such jigs.

13. The combination of claim 12 wherein the tray receiving pocket of each jig has a closed lower region whereby when a plurality of such jigs are stacked an above positioned jig is on top of a lower positioned jig and whereby when a tray is placed in the lower positioned jig, such upper position jig operates as a cover to said lower positioned jig with tray.

14. The combination of claim 11 wherein said jig has a jig height, wherein the tray receiving pocket has a pocket depth, and wherein the component tray of the second size has a tray thickness, and wherein a tray of the second size placed in the tray receiving pocket is less than or equal to the pocket depth.

15. A combination jig for holding a plurality of matrix trays and a plurality of matrix trays, each of said matrix trays having a plurality of component pockets arranged in a matrix pattern for holding a plurality of integrated circuit components, said jig comprising pocket perimeter portions defining a tray receiving pocket, said jig including top side stacking structure and bottom side stacking structure, said top and bottom side stacking structure figured to be cooperating whereby a plurality of jigs are vertically stackable such that when vertically stacked with matrix trays therebetween, substantial lateral movement between one jig and the adjacent stacked jig is eliminated.

16. The combination of claim 15 wherein each tray receiving pocket has a bottom panel whereby when a pair of jigs are stacked with matrix trays in the pockets therebetween, the matrix trays are covered by said bottom panels.

17. An adaptor jig for holding a component tray and a rectangular component tray, the component tray configured for holding a plurality of integrated circuit components in a matrix arrangement, the jig comprising:

a rectangular support structure having a top side, a bottom side, a rectangular peripheral portion, and a plurality of perimeter portions on the top side defining a tray receiving pocket, said tray receiving pocket sized for the rectangular component tray, the pocket perimeter portions including a fixed positioning portion configured as a corner; and a first moveable tray positioning member extending from the support structure into the tray receiving pocket, said first tray positioning member having a bias inwardly towards said pocket for urging a tray in said pocket towards said fixed positioning portion.

18. The combination of claim 17 wherein the first and second tray positioning members are spherical wherein the jig further comprises first and second coiled springs engaged with said first and second positioning member respectively for providing the inward bias to said first and second tray positioning members.

19. The combination of claim 17 wherein the support structure is formed of injection moldable plastic and wherein the first and second tray positioning members are integrally formed with the support structure.

20. The combination of claim 19 wherein the first and second tray positioning members are configured as fingers extending along their respective sides of the tray receiving pocket.

21. A combination adapter jig for holding a component tray and a component tray, the component tray configured for holding a plurality of integrated circuit components in a matrix arrangement, the jig comprising:

a rectangular plastic support structure having a top side, a bottom side, a rectangular peripheral portion, and a plurality of perimeter portions on the top side defining a tray receiving pocket, said tray receiving pocket sized for rectangular component tray; and a first resiliently flexible and moveable tray positioning member made of plastic, integral with, and extending from the support structure into the tray receiving pocket, said first tray positioning member having a bias inwardly towards said pocket when flexed outwardly from said pocket for securing the tray in said pocket.

* * * * *